United States Patent [19]

Lipovski

[11] Patent Number: 5,694,406
[45] Date of Patent: Dec. 2, 1997

[54] PARALLEL ASSOCIATIVE PROCESSOR FORMED FROM MODIFIED DRAM

[75] Inventor: G. Jack Lipovski, Austin, Tex.

[73] Assignee: Board of Regents, the University of Texas System, Austin, Tex.

[21] Appl. No.: 695,125

[22] Filed: Aug. 5, 1996

Related U.S. Application Data

[63] Continuation of Ser. No. 237,225, May 2, 1994, which is a continuation of Ser. No. 132,444, Oct. 6, 1993, abandoned, which is a continuation of Ser. No. 929,816, Aug. 14, 1992, abandoned, which is a continuation of Ser. No. 577,991, Sep. 5, 1990, Pat. No. 5,184,325, which is a continuation-in-part of Ser. No. 321,847, Mar. 10, 1989, Pat. No. 4,989,180.

[51] Int. Cl.[6] .................................................. G06F 11/00
[52] U.S. Cl. ............................................................ 371/51.1
[58] Field of Search ...................... 365/189.07, 189.02, 365/222, 200, 49; 371/51.1

[56] References Cited

U.S. PATENT DOCUMENTS

| | | | |
|---|---|---|---|
| 3,508,220 | 4/1970 | Stampler | 340/174 |
| 3,810,108 | 5/1974 | Krewson et al. | 340/172.5 |
| 3,997,882 | 12/1976 | Goyal | 340/173 AM |
| 4,065,756 | 12/1977 | Panigrahi | 365/49 |
| 4,172,282 | 10/1979 | Aichelmann et al. | 364/200 |
| 4,185,323 | 1/1980 | Johnson et al. | 365/222 |
| 4,232,376 | 11/1980 | Dion et al. | 365/222 |
| 4,277,833 | 7/1981 | Chambers | 365/222 |
| 4,277,838 | 7/1981 | Chambers | 365/222 |
| 4,450,520 | 5/1984 | Hollaar et al. | 364/200 |
| 4,507,748 | 3/1985 | Cotton | 364/749 |
| 4,590,465 | 5/1986 | Fuchs | 340/723 |
| 4,598,400 | 7/1986 | Hillis | 370/60 |
| 4,636,982 | 1/1987 | Takemae et al. | 365/230.06 |
| 4,646,326 | 2/1987 | Davis et al. | 371/49.2 |
| 4,677,592 | 6/1987 | Sakurai et al. | 365/222 |
| 4,701,879 | 10/1987 | Scarr | 365/49 |

(List continued on next page.)

OTHER PUBLICATIONS

Bush, "As We May Think," *Atlantic Monthly*, pp. 101–108 (Jul. 1947).

Lee, "Intercommunicating Cells, Basis for a Distributed Logic Computer," *Proc. EJCC*, pp. 130–136, 192 (1962).

Lee et al., "A Content Addressable Distributed Logic Memory with Applications to Information Retrieval," *Proceedings of the IEEE*, vol. 51, pp. 924–932 (Jun. 1963).

Crane et al., "Bulk Processing in Distributed Logic Memory," *IEEETC*, vol. EC–14, pp. 186–196 (Apr. 1965).

Slotnick, "Logic Per Track Devices," *Advances in Computers*, pp. 291–296 (1971).

M. Batcher, "The Flip Network in Staran," *Proc 1976 Int'l Conf. on Parallel Processing*, pp. 65–71 (Aug. 1976).

Lipovski, "Architectural Features of CASSM: A Context Addressed Segment Sequential Memory," *Proceedings of the 5th ISCA*, pp. 31–38 (Apr. 3–5, 1978).

Bray et al., "Data Base Computers," pp. 106–120 (D.C. Heath & Co. 1979).

Hollaar, "Text Retrieval Computers," *Computer*, vol. 12, No. 3, pp. 40–52 (1979).

Fuchs et al., "Developing Pixel–Planes, A Smart Memory–Based Raster Graphics System," 1982 Conference on Advanced Research in VLSI, pp. 371–380 (MIT Jan. 27, 1982).

(List continued on next page.)

Primary Examiner—Vincent P. Canney
Attorney, Agent, or Firm—Louis J. Hoffman

[57] ABSTRACT

A parallel associative processor is formed from a DRAM circuit whose storage positions are organized into words, which are further subdivided into columns. Each column is associated with a sense amplifier, which is used to perform data refreshing. Comparators are coupled to the sense amplifiers to permit logical operations, including comparisions with external data placed on a bus, to be performed on data addressed and read from the storage positions, including during refresh operations. A latch or flip-flop with control inputs is associated with each word, to hold a match or mismatch signal identifying, in parallel for each word, the results of the logical operations.

20 Claims, 5 Drawing Sheets

U.S. PATENT DOCUMENTS

| | | | |
|---|---|---|---|
| 4,706,221 | 11/1987 | Satoh et al. | 365/222 |
| 4,709,327 | 11/1987 | Hillis et al. | 364/200 |
| 4,710,935 | 12/1987 | Kim et al. | 371/49.2 |
| 4,716,552 | 12/1987 | Maltiel et al. | 365/222 |
| 4,718,041 | 1/1988 | Baglee et al. | 365/185 |
| 4,747,072 | 5/1988 | Robinson et al. | 364/900 |
| 4,748,439 | 5/1988 | Robinson et al. | 340/146.2 |
| 4,749,887 | 6/1988 | Sanwo et al. | 371/49.2 |
| 4,775,810 | 10/1988 | Suzuki et al. | 371/49.2 |
| 4,783,649 | 11/1988 | Fuchs et al. | 340/747 |
| 4,794,559 | 12/1988 | Greenberger | 365/49 |
| 4,799,192 | 1/1989 | Wade et al. | 365/49 |
| 4,831,585 | 5/1989 | Wade et al. | 365/49 |
| 4,833,642 | 5/1989 | Ooi | 365/49 |
| 4,835,733 | 5/1989 | Powell | 264/900 |
| 4,931,994 | 6/1990 | Matsui et al. | 365/225 |
| 4,989,180 | 1/1991 | Lipovski | 365/189.07 |
| 4,991,136 | 2/1991 | Mihara | 365/49 |
| 5,184,325 | 2/1993 | Lipovski | 365/189.07 |
| 5,214,715 | 5/1993 | Carpenter | 382/15 |
| 5,285,411 | 2/1994 | McAulay | 365/49 |

OTHER PUBLICATIONS

*IC Memories Data Book*, pp. 356–363 (Hitachi Mar. 1987).

Hodges et al., "Dynamic Read–Write Memories," *Analysis and Design of Digital Integrated Circuits*, Sec. 9.3, pp. 372–380 (McGraw–Hill, 2nd ed. 1988).

Lineback, "SEEQ'S 512–KBIT Flash EEPROMs Support In–System Programming on 12–v Supply" (1988).

Johnson, "Design and Analysis of Fault–Tolerant Digital Systems," pp. 63–65 (Addison–Wesley 1989).

Robinson, "Chameleon: A Pattern Matching Memory System," Technical Report HPL–SAL–89–24 (Hewlett Packard Co. Apr. 19, 1989).

Lipovski, G.J., "A Four Megabit Dynamic Systolic Associative Memory Chip," Dept. of Elec. and Computer Engr., Univ. of Texas, Austin, Texas (Sep. 4, 1990).

Thompson, Karl Kelvin, "Ray Tracing with Amalgams," Dissertation, University of Texas at Austin (May 1991).

PARALLEL ASSOCIATIVE PROCESSOR FORMED FROM MODIFIED DRAM

This is a continuation of application Ser. No. 08/237,225, filed May 2, 1994, which is a continuation of application Ser. No. 08/132,444, filed Oct. 6, 1993, abandoned, which is a continuation of application Ser. No. 07/929,816, filed Aug. 14, 1992, abandoned, which is a continuation of application Ser. No. 07/577,991, now U.S. Pat. No. 5,184,325, which is a continuation-in-part of application Ser. No. 07/321,847, filed Mar. 10, 1989, now U.S. Pat. No. 4,989,180.

FIELD OF INVENTION

The invention relates to refreshable dynamic associative memory storage devices.

BACKGROUND OF THE INVENTION

Figure 1:
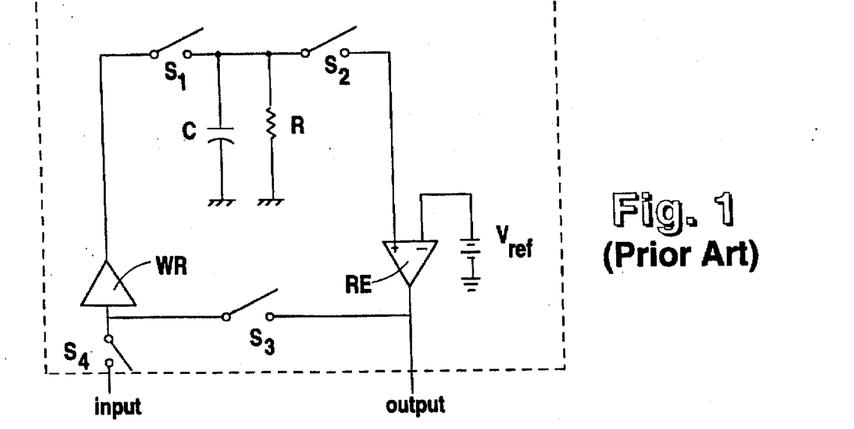
FIGS. 1 and 2 are schematic representations of prior art dynamic random access memories.

Referring to FIG. 1, a schematic of a typical construction of a dynamic random access memory (DRAM) is shown. During the write mode, data to be written into the DRAM is applied to the input and amplified by write amplifier WR. Switches S2 and S3 are open, switches S1 and S4 are closed, and capacitor C is either charged or discharged according to the status of the input data, and amplified by write amplifier WR. During the read mode, switches S1, S3 and S4 are open, and switch S2 is closed so that the voltage on capacitor C is compared to a reference voltage Vref by read amplifier RE. According to the difference determined by read amplifier RE, either a binary "one" or "zero" is transmitted to the output of the DRAM. When in the data-hold mode, all the switches S1, S2, S3 and S4 remain open so that the stored charged remains in capacitor C. However, due to the unavoidable presence of leakage resistance R, the capacitor charge will gradually dissipate. To compensate for this, a process called refreshing must be periodically used in the DRAM. To achieve refreshing, all three switches S1, S2 and S3 are closed, switch S4 is open, and the binary state detected by read amplifier RE is amplified by write amplifier WR and reapplied to storage capacitor C. Switches S3 and S4 thus form a multiplexer which selects either input data or refresh data for application to write amplifier WR. The dashed line in FIG. 1 represents the boundary of an integrated circuit chip. Elements within the dashed line are typically integrated on a single chip.

Figure 2:
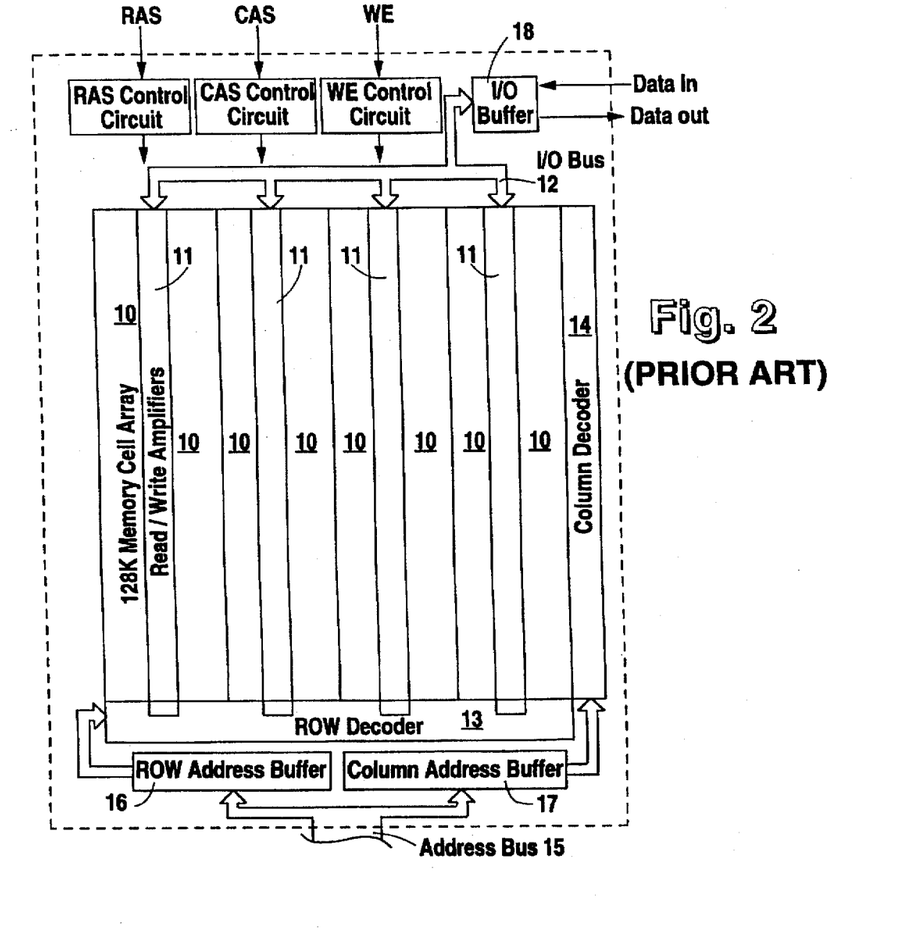

In practice, a DRAM includes a great number of storage capacitors C arranged in matrix or array form along with row decoder and column decoder circuitry. The storage elements of the array must be periodically refreshed, and are typically refreshed on a row-by-row basis. The row decoder and column decoder circuitry, as well as the read amplifiers and write amplifiers, are typically integrated within the same semiconductor chip with the individual storage elements of the array. FIG. 2 is a block diagram of a type HM 511000 dynamic RAM available from Hitachi America, Ltd., which includes eight 128k memory cell arrays 10 connected through read/write amplifiers 11 to r/o bus 12. Individual rows and columns of the cell arrays 10 are selected by row decoder 13 and column decoder 14, under control of address data contained on address bus 15 via row address buffer 16 and column address buffer 17, and under control of row access strobe signal RAS, and column access strobe signal, CAS. Reading and writing is controlled by read/write input, WE, and serial input and output data is buffered in I/O buffer 18. Once again, elements within the dashed line in FIG. 2 are integrated together on a single chip.

When logical operations are required to be performed on data stored in a DRAM, data must be read from the desired storage elements of the array and applied to the single-bit serial output of the DRAM for application to logic circuitry external to the integrated circuit chip. After the logic function is performed, the result is applied to the single-bit input of the DRAM for buffering and storage in desired storage elements of the array. Such operation of a dynamic RAM found, for example, in single-instruction-multiple-datastream (SIMD) computers wherein a single logical operation is performed on a plurality of data elements. Such SIMD operations may be performed cyclically in order to trade off cost for speed. During cyclic operation, the same operation is performed in one or more data cells, and within each data cell, the operation is performed identically on one or more data words which are processed sequentially. However, as mentioned above, periodic refreshing of the dynamic RAM is necessary in order to avoid dissipation of the data indicating charge on the storage capacitor. This refreshing is generally interleaved with any logical operations performed on the data, which necessarily limits the speed at which cyclic logical operations can be performed on data stored in a dynamic RAM.

SUMMARY OF THE INVENTION

The present invention avoids the drawbacks of the prior art by incorporating logic circuitry within the refresh circuitry of a dynamic RAM which allows performance of cyclic logical operations on stored volatile data, concurrent with the periodic refresh of the volatile data. Thus, all data being refreshed is processed by a simple logical unit in the refresh circuit. This combination of refresh with logical operation eliminates the need for a separate refresh cycle by performing the logical operation during the refresh cycle, and greatly improves the cyclic processing speed of logical operations performed on stored data.

The present invention has particular application in data base or associative systems wherein all stored data is accessed and tested, for example, when conducting data string searches. In such a data base searching system, a data comparator is inserted into the refreshing loop, and is used to compare target data with data being cyclically refreshed in order to simultaneously perform data refresh and target data searching.

DETAILED DESCRIPTION OF THE PREFERRED EMBODIMENT

Figure 3:
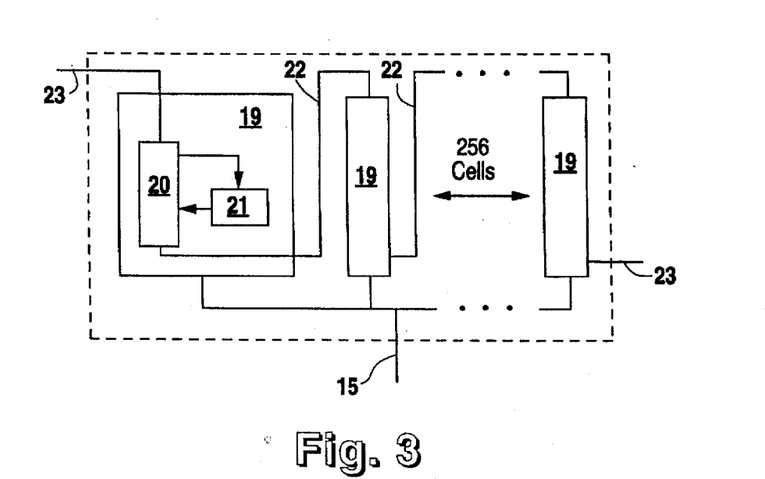
FIG. 3 is a dynamic random access memory employing logic in refresh circuitry, according to the present invention.

Referring to FIG. 3, a one megabit volatile memory employing logic-in-refresh according to the present invention is disclosed. The memory is organized within the chip as a 512 row, 2048 bit-per-row memory in which an entire 2048 bit row is read, one after another, in each refresh cycle. The refresh row unit length might be different from the length of the associative memory word unit that can be searched or output as a unit. Either the entire 2048 bit row, or a fraction of the 2048 bit row, can be considered a single word in an associative memory. For example, referring to FIG. 3, if an 8-bit byte is chosen as the length of the associative memory word in a 1 megabit memory, 256 cells 19 result, each having a 512 word memory array 20, 8-bits-per-word. Herein, a "word" is a unit of data that is considered as a whole, a "row" refers to a unit of data read or written as a whole, and a "byte" is that portion of a row contained in a word.

According to the present invention, each cell 19 includes logic circuitry, such as comparator 21, to operate on the data as it is sequentially and cyclically read out, refreshed and written back into memory. During a refresh operation, a 9-bit counter, either external or internal to the chip, provides 512 consecutive row addresses, one address per memory refresh cycle. Thus, all words of each cell 19 of the memory are read in 512 memory refresh cycles and are searched during that time. For one mode of operation, the bottom byte of each cell 19 is logically linked to the top byte of the next cell 19 within a single chip by bus 22. In another mode of operation, each word, as a sequence of 512 bytes, is considered separately. Elements within the dashed line are integrated together in a single semiconductor material integrated circuit chip. A plurality of chips can be cascaded by logically linking the bottom word of the last cell in one chip to the top of the next cell in the neighboring chip by bus 23.

Figure 4:
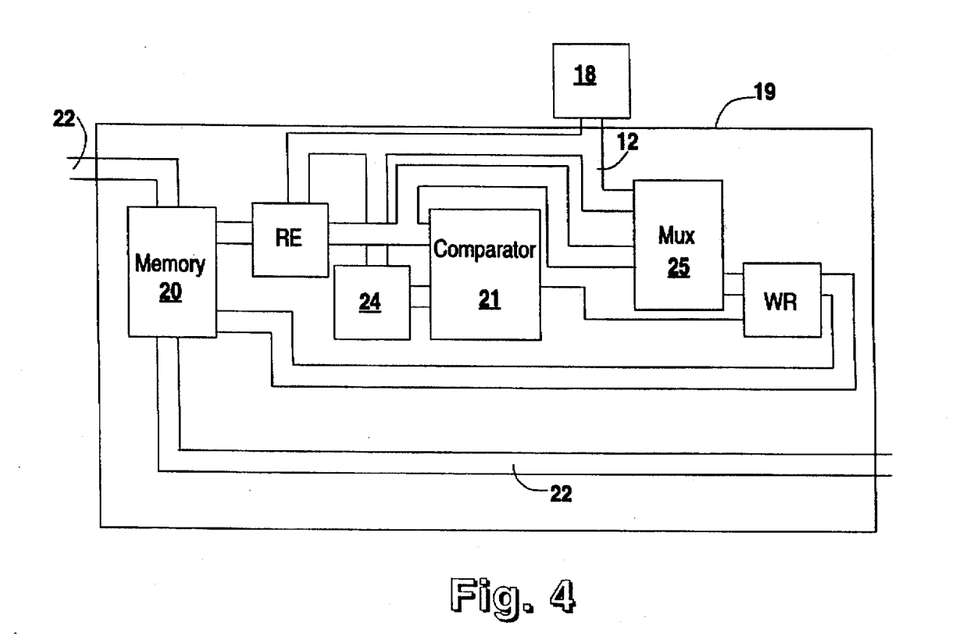
FIG. 4 is a dynamic random access memory employing search logic in the refresh circuitry, according to the present invention.

The configuration of each cell 19 is shown in more detail in FIG. 4. Referring to FIG. 4, data stored in each byte can be, for example, ASCII characters in text streams, which are each 7 bits wide together with a mark bit which is the 8th bit. Initially, all mark bits are cleared, and are subsequently set and cleared to mark the results of a search. Each byte is sequentially read by the 8-bit wide read amplifier, RE, and the 7 data bits are applied to comparator 21 where the read 7-bit byte is compared with the 7-bit comparand stored in comparand register 24. A comparand is loaded into comparand register 24 through I/O bus 12.

The output of read amplifier, RE, is also applied to multiplexer 25 along with data from I/O buffer 18 through I/O bus 12. The output of multiplexer 25 is applied to 8-bit write amplifier, WR, along with the single-bit (mark bit) output of comparator 21. Read amplifier, RE, is also connected to I/O bus 12 in a known manner through tri-state buffers, or the like, to enable outputting of data. Thus, according to the present invention, comparator 21 and comparand register 24 are added to the preexisting refresh circuitry of a DRAM illustrated schematically in FIG. 1 (note that switches S3 and S4 illustrate the function of multiplexer 25). All components are integrated on the same semiconductor material integrated circuit chip.

In operation, to search-and-mark byte, a byte-wide comparand is simultaneously broadcast to all cells 19, and stored in respective comparand registers 24. Then, the 512 bytes in memory array 20 of each cell 19 are each cyclically read, refreshed and rewritten. The 8th bit of each byte stores the result of any match with the comparand in comparand register 24. The results of the match are stored in 8th bit of the next byte in memory array 20 adjacent and below the one that the comparand matches. This is repeated for all 512 bytes in each cell 19. The result of a search on the last byte of a cell is effectively stored in the first byte of the adjacent cell through bus 22.

If all mark bits are cleared, and the comparand searches for a 7-bit character and a zero as the 8th bit, an unconstrained search for a character is done. If the comparand searches for a character and a 1 in the 8th bit, a search for the character will then match the comparand only if the previous byte stored in memory array 20 matched the previous comparand searched. Thus, a string of characters can be searched for one character in each successive refresh operation.

A variation of this operation is to continue to mark bytes in memory until a match is found. In this variation, once the 8th bit (mark bit) of a byte has been set, as bytes continue to rotate through the refresh circuitry, the 8th bit of all subsequent bytes are set until a match for the next comparand (for example, an end-of-text character) is found. This variation is used to mark the remainder of a target string of characters, once a character within the target string is found, and facilitates output of or rewriting the target string.

The output of the result of a search from a single cell can simply be read out as the character into I/O buffer 18 if the 8th bit is set. As a byte passes the refresh logic, if the 8th bit is set, the byte is presented by read amplifier, RE, to I/O buffer 18, and the 8th bit will then be cleared. In a multiple cell system, if two cells have the 8th bit set in the same word in each cell, a priority circuit connected to the cells will prevent all but one of the outputs from feeding I/O buffer 18, and clearing the 8th bit. Only one byte will be output at a time, and remaining bytes will be output in later refresh cycles.

After power is applied, a means to fill memory with identical bytes is used to empty the memory. To fill an empty memory with a string of characters, a ripple priority mechanism can be used to modify the basic search and match mechanism so that only the first byte that satisfies the search part is modified, but no other bytes that satisfy the search are altered. Within a single cell, a flip-flop is set as the bytes in the cell are being searched, and is cleared after a successful search is detected. The byte is modified in a successful search only if the flop-flop output is 1. One byte can be written in each refresh cycle by this means. In a multiple cell system, a ripple priority circuit is also used between cells. The priority circuit causes all flip-flops except the flip-flop in the prior cell to be cleared. This prioritized context-addressing mechanism is needed to fill memory with different data in each byte.

Figure 5:
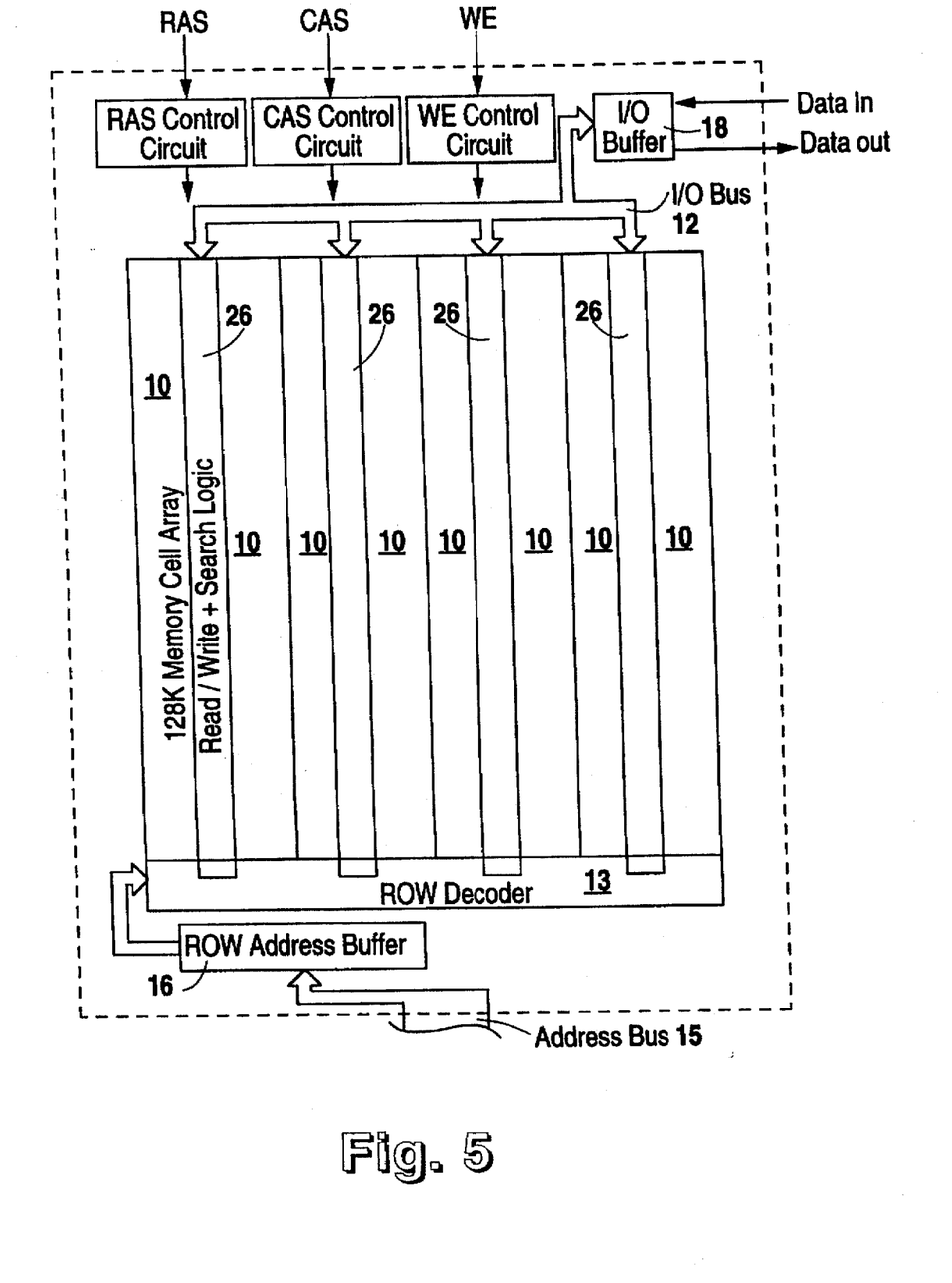
FIG. 5 is a block diagram of a 1 megabit dynamic random access memory employing logic in refresh circuitry according to the present invention.

The above-disclosed additional search logic can be easily implemented in exitting dynamic random access memories by using preexisting memory cells, row decoders, read amplifiers, write amplifiers and multiplexers but removing the column decoders and inserting search logic including the comparator and comparand register into the read/write circuits. If this is done, for example in the Hitachi H511000 (a 1 megabit DRAM), the entire memory can be read, searched and rewritten in approximately 60 microseconds (the time required to refresh the entire memory). Such a memory is shown in FIG. 5 and illustrates placement of search logic 26. If a system incorporates a number of memory chips, and a string of characters is searched, the time required to search all data in memory will remain 60 microseconds per character searched.

Although content search and update, input and output are the logical operations herein disclosed, it will be understood that other logical techniques can also be implemented. For example, the various techniques used for searching and updating a data base, such a relational data base, as disclosed in "Architectural Features of CASSM; A Context Addressed Segment Sequential Memory," Proc. 5th ISCA, pp 31–38, April 1978, authored by the present inventor, and related work on the CASSM system cited in that paper, can be implemented. Other modifications, additions or deletions can also be made without departing from the scope of the invention. For example, the present invention is equally applicable to memories, only a portion of which is dynamic memory.

The invention thus allows associative searching of a dynamic memory integrated circuit with a redesign of only a small part (removing column decoders, and adding comparators and comparand registers to the refresh circuitry) of a preexisting chip memory. This results in low development cost, little if any increase in manufacturing cost and utilization of existing DRAM facilities without the need for extensive retooling. Use of the invention will allow associative searching of very large data bases stored entirely in fast dynamic memory with very little increase in cost over an unmodified dynamic random access memory.

Figure 6:
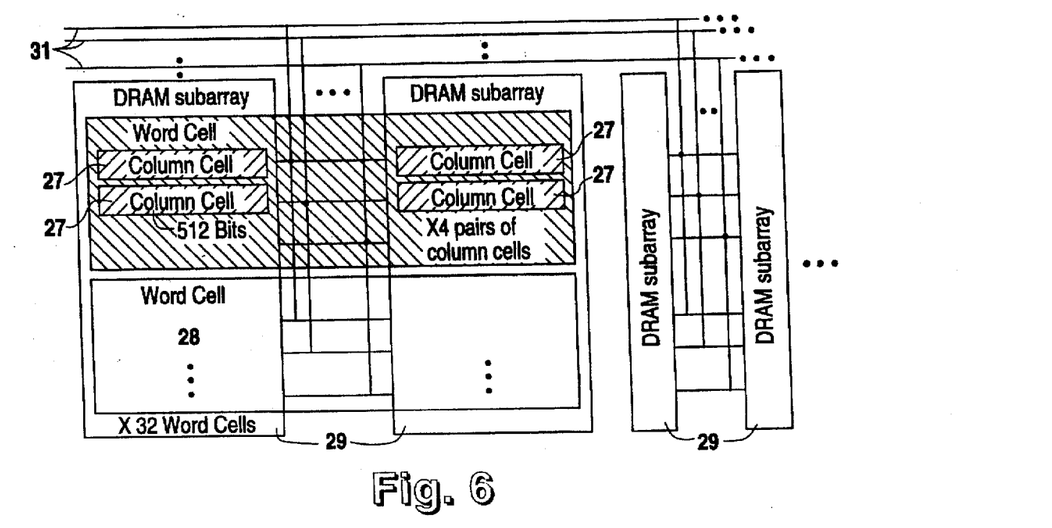
FIG. 6 is another block diagram of a dynamic random access memory employing logic in refresh circuitry according to another embodiment of the present invention.
Figure 7:
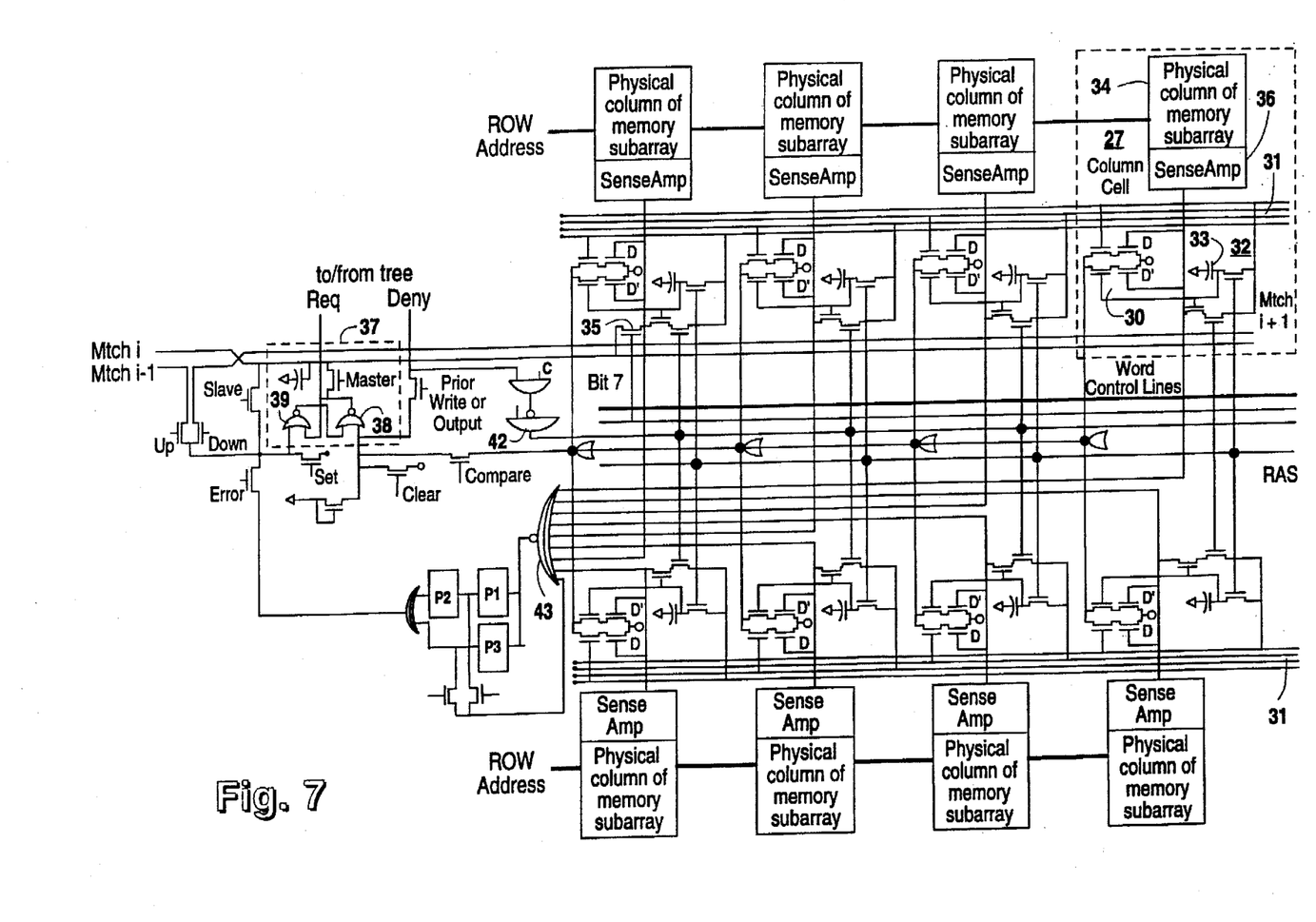
FIG. 7 is a detailed block diagram of a word cell of FIG. 6.

FIGS. 6 and 7 illustrate the organization of a semiconductor chip incorporating another embodiment of the present invention. As mentioned above, it is important to only slightly modify the architecture of an existing DRAM chip (FIG. 1), keeping the memory array in tact, so that the cost of modifying the design of an existing DRAM chip to produce the present invention will be small relative to the cost of designing a full chip.

Referring to FIG. 6, in a refresh operation, one column is refreshed sequentially, one bit after another, using one sense amplifier. The data in the column, stored in column cells 27, are collected together in groups of four pairs of column cells each to form word cells 28. Thirty-two word cells are arranged to create a pair of DRAM subarrays 29, and the chip includes eight pairs 29 of DRAM subarrays. Thus, in a one megabit memory, each column cell includes 512 bits.

As explained above, in a refresh operation, one column is refreshed sequentially, one bit after another, by one sense amplifier. For simplicity, as shown in FIG. 6, the eight column cells 27 forming each word cell 28 can be considered as four columns in each of two neighboring DRAM subarrays, thereby forming the four-column two-row rectangle shown to read or write one byte at a time. Of course, any number of column cells per word cell can be used. Connecting each of the column cells is a data bus 31.

Referring to FIG. 7, a detailed block diagram of a word cell used in FIG. 6 is shown. In FIG. 7, eight identically configured column cells 27 are presented. For clarity, only the upper left column cell 27 in FIG. 7 is described. However, it is understood that each of the other seven column cells in FIG. 7 are configured identically. Each column cell 27 includes a mask flip-flop 32 including storage capacitor 33 which stores a mask bit for each refresh cycle. Also included in each column cell 27 is a physical 512 bit memory subarray 34 and dedicated sense amplifier 36. In this embodiment, each column cell 27 also includes a four transistor comparator 30. The output of each word cell is commonly connected in a wire-OR configuration to a dual-rank (master slave) set-clear match flip-flop 37 which includes two NOR gates 38 and 39 which are, in turn, connected to set and clear inputs of flip-flop 37. Capacitor 41 within flip-flop 37 stores a match bit.

As noted earlier, a refresh cycle is a period of time required to refresh one bit of one column with one sense amplifier, and is performed simultaneously for each column in the memory. A refresh cycle is divided into a row address strobe time (TRAS), where row address strobe is asserted, and a column address strobe time (TCAS), where column address strobe is asserted. TCAS is distinct from and after TRAS. Also as noted earlier, a refresh operation is the period of time required to refresh all bits within a single column.

According to the present invention, during TRAS, a mask is sent on data bus 31 and is stored in mask flip-flop 32, and during TCAS, data is sent on data line 31. This is directly analogous to the time-multiplexing of row address and column address in a convention DRAM. In a refresh operation, the large (4096 bit) data and mask values are time-multiplexed on 8-bit data bus 31. For example, if in a refresh operation, the data value is a 4096 hexadecimal bit value of the form, for example, 1234 ..., and the mask value is a 4096 hexadecimal bit value, for example, 5678 ..., then in the first refresh cycle in the refresh operation, hexadecimal 56 is sent during TRAS, and hexadecimal 12 is sent during TCAS. In the second refresh cycle of the refresh operation, hexadecimal 78 is sent during TRAS, and hexadecimal 34 is sent during TCAS, and so forth. In all, 512 pairs of bytes are sent sequentially as they are used to search or write data as it is being refreshed inside each word cell. In a write step, the pair of bits sent in the same position in the data and mask bytes during TCAS and TRAS will be 10 when the comparand value is a 0, 11 when the comparand value is a 1, and 00 when the comparand value is a don't care. In a compare step, however, in order to reduce comparator logic, the pair of bits sent during TCAS and TRAS will be 01 when the comparand value is a 0, 10 when the comparand value is a 1, and 00 when the comparand value is a don't care.

According to the present invention, when the circuitry of FIG. 7 is added to the refresh circuitry of a DRAM, an associative memory structure is presented which allows the associative searching of data within the memory as it is being refreshed.

Specifically, a No-op instruction which does nothing but refresh the memory for one refresh operation, is accomplished by amplifying data with sense amplifier 36 and writing that data back into the memory cell 34 without modification. No data goes to or from data bus 31.

During a Word Compare instruction, a data and mask value bit is used for each column, and each column is searched for all words in all memory chips during one refresh operation. A match bit for a word is set if for each column that the mask bit is 1, the data bit is the same as the bit in the word and column. More specifically, for a Word Compare instruction, match flip-flop 37 is set to 1 at the beginning of the refresh operation. In each refresh cycle, the mask and data are sent, the left bit being sent first during TRAS and stored in mask flip-flop 37 in each bit cell, with the right bit being sent during TCAS. If the word has a 0 and the first bit is a 1, then match flip-flop 37 is cleared. If the word has a 1 and the second bit is a 1, then match flip-flop 37 is cleared. The control signal Compare is asserted at the end of the refresh cycle when comparator 30 has stabilized, in order to clear match flip-flop 37 if a mismatch is detected. Data in a cell is refreshed during a Word Compare instruction.

During a Word Write instruction, three-input and gate 42 is itilized. The mask data stored in mask flip-flop 32, and sensed data are sent during TCAS and are used to rewrite data in the cell. If in a word cell the Mask and Match bits are both high, data is rewritten into the cell. Otherwise, data in the cell is refreshed. During a Word Output instruction, during TRAS, a high signal is sent on data bus 31 so as to output all bits. During TCAS, the Word Write instruction is asserted and data from sense amplifier 36 is applied to data bus 31 and is also refreshed in the cell.

For the next set of instructions, words are considered linearly ordered (top to bottom) and prioritized (higher words are considered to be of higher priority). In addition, these instructions take advantage of the word structure mentioned earlier wherein the most significant bit in a word is a mark bit distinct from the character bits of a byte.

During a Character Compare instruction, the master of match flip-flop 37 is initially set and the Word Compare instruction is executed on the whole byte to clear match flip-flop 37 if there is a mismatch where the mask bits are 1. Then, the slave of match flip-flop 37 is written into the mark bit (high order bit) of the next byte using extra transistor 35 (by delaying the signal from the slave match flip-flop 37 one refresh cycle time), and finally, the master of match flip-flop 37 is copied into the saved flip-flop. Data is refreshed in a Character Compare step.

In a Word Compare Up instruction, the Word Compare instruction is executed during each refresh cycle of a refresh operation. The contents of the match bits are then shifted upward one bit logically at the end of the refresh operation. Similarly, a Word Compare Down instruction executes the Word Compare instruction during each refresh cycle of a refresh operation, and then, at the end of the refresh operation, the contents of the match bits are shifted downward one bit logically. A Word Compare Prior instruction executes the Word Compare instruction during each refresh cycle of a refresh operation, and then clears the match bits downward from the first one that is set at the end of the refresh operation.

To execute a Word Output instruction, for the prior word cell having the match bit set, one refresh operation is used to output one word, and at the end of each refresh operation, the match bit of the word outputted is cleared. The Word Output instruction is repeated until all match flip-flops are cleared. To execute a Word Write instruction, for the prior word cell having the match bit set, for each refresh operation, a word is written and the match bit is cleared. The operation is repeated until all match flip-flops are cleared.

A typical instruction begins with the transmission of an appropriate instruction code on the data lines during a period of time that the memory executes a No-op instruction. As mentioned above, during each refresh operation, 512 refresh cycles occur, and the instruction is executed during each of the refresh cycles.

The memory requires comparand data to be supplied very rapidly. Data to and from the memory could be supplied by a video RAM, or by use of a technique known as "shuttle memory," wherein a pair of static RAMs are connected by multiplexers to the associative memory and a conventional host computer so that when one is connected to one the other is connected to the other. As the computer rewrites data in one static RAM, a fast counter addresses the other to read or write consecutive words in it to or from the associative memory during one refresh operation. At the end of the refresh operation the pair are exchanged, thus shuttling the static memories to and from the associative memory and computer.

Figure 8:
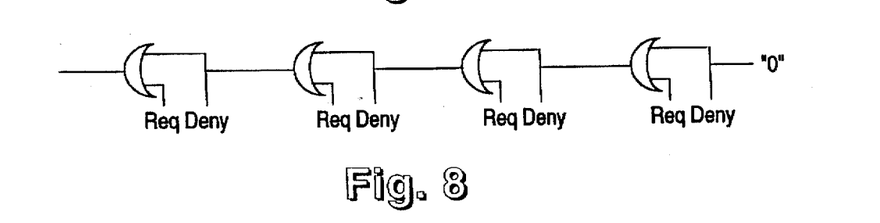
FIG. 8 is a chain priority circuit usable in the present invention.
Figure 9:
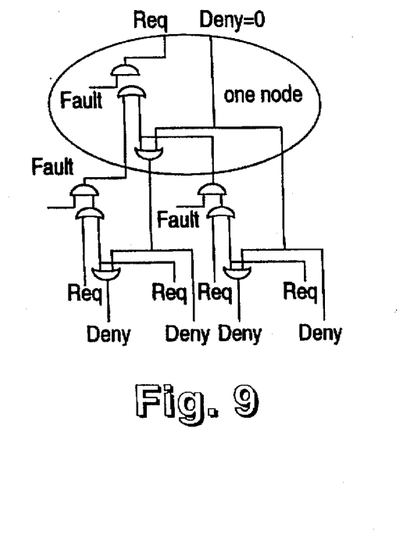
FIG. 9 is a priority tree circuit usable in the present invention.

To facilitate multiple cell operations, particularly during execution of the Compare Prior, Write and Output instructions, a priority line is required. Priority selection can be understood in a chain of OR gates, as illustrated in FIG. 8. A request causes a 1 to ripple through the OR gates leftward, causing any request there to be denied. This priority chain is implemented according to the preferred embodiment using lookahead binary tree for speed and fault-tolerance. FIG. 9 shows a two-level tree. A deny equals 0 is put into its root, and Request and Deny of the leaf nodes are connected to match flip-flops 37 (FIG. 7). The Compare Prior instruction can clear non-prior (denied) match flip-flops. The effective match value used in Write and Output instructions has to be true in only one cell, the prior cell. Three-input AND gate 42 cancels a match in non-prior cells if input C1 is asserted.

Figure 10:
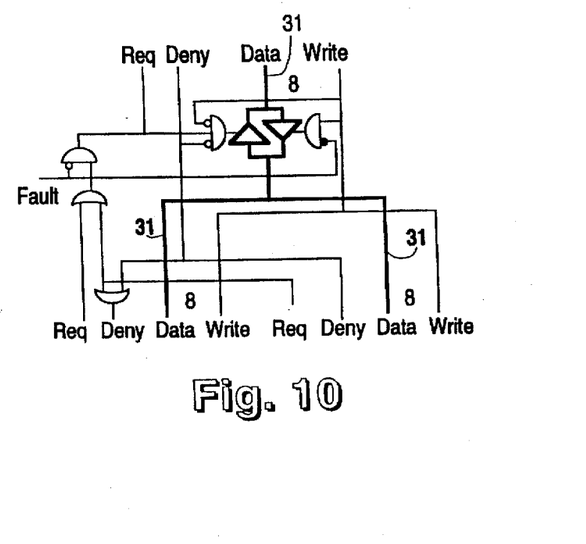
FIG. 10 is a node in a data bus and priority tree usable in the present invention.

A priority network for data bus 31 is shown in FIG. 10 and is a binary tree of bidirectional bus drivers controlled by the priority tree of FIG. 9. The root of the priority tree of FIG. 10 is connected to an external controller having a shuttle memory, and the leaves are connected to word cells. When data is sent to the cells, all leaf-ward directed bus drivers are enabled and all root-ward directed bus drivers are disabled. When data is collected from the cells, the opposite is true. The match value determines the prior cell, which outputs data. Note that the priority tree of FIG. 10 can be used to guide data in data bus 31.

Referring once again to the circuit of FIG. 7, appearing in the lower right hand corner thereof is a simple error detection circuit which uses one parity bit for all of the data bits in a word cell. All of the column cell data lines are connected and input to exclusive-OR gate 43. At the beginning of a refresh operation, dual-rank flip-flops P1 and P3 are initialized to zero, and early in a refresh cycle, flip-flop P3 is loaded with the exclusive-OR of all eight data bits which are read from memory along with the old value of P3. Later in the refresh cycle, flip-flop P1 is loaded with the exclusive-OR of all eight data bits which are written into memory along with the old value of flip-flop P1. At the end of a refresh operation, flip-flop P1 contains the parity of all the data bits that have just been stored in the cell's memory. The output of flip-flop P1 is stored in flip-flop P2. At the end of a refresh operation, flip-flop P3 contains the parity of all the data bits that have just been read back from the cell's memory. The parity computed and stored in flip-flop P2 should match the parity computed and stored in flip-flop P3. If the computed parity in P2 differs from the stored parity in P3, there is a parity error in the data. The error signal is applied to the master of match flip-flop 37 when the match bit is stored in the slave of match flip-flop 37 at the end of a refresh operation.

Faulty cells can be handled by pruning the trees used for next neighbor connection in the bus. By asserting the fault line (FIGS. 9 and 10), data bus 31 is pruned to isolate an error in a subtree, forcing open both tri-state drivers in the link above the subtree, and the priority tree is pruned in a node above the faulty tree, forcing a request of 0 into the rest of the tree.

It is believed that the cost of the modified associative DRAM chip according to the present invention will be similar to the cost of current DRAMs. A typical DRAM sense amplifier has six transistors, and its column address decoder has four transistors. Removing the column address decoder, as required by the present invention, and adding one bit of mask, a comparator, and a parity checking exclusive-OR gate (together implemented with approximately eleven transistors), slightly increases the sense amplifier size. According to the present invention, each Word cell has a match flip-flop, parity checking flip-flops, and associated logic requiring approximately 35 transistors, and for each word cell there is a node of the priority tree, requiring approximately six transistors. Amortizing this word cell logic over the total number of sense amplifiers in the word cell, on the order of five additional transistors would be required per sense amplifier. Thus, the present invention would require approximately 24 transistors per sense amplifier, thereby only slightly increasing the required integrated circuit chip area. Moreover, since address pins are omitted, a chip embodying the present invention could be packaged in an 18-pin package (VDD, VSS, RAS and CAS clock and a signal to indicate the start of a refresh operation, a right signal to control the data bus direction, two shift pins, request-deny signals, and eight data lines). Thus, according to the present invention, searching of an associative DRAM is accomplished using circuitry integrated within the refresh circuitry on the same integrated circuit chip as the memory array. This results in highly parallel logical operations being performed on data in memory cell arrays, in addition to using the high band width data paths that exist in refresh circuitry.

I claim:

1. A processor formed from a dynamic semiconductor memory chip supporting:
   (a) a multitude of single-bit storage cells distributed among a plurality of word cells;
   (b) wherein the bit cells of each word cell are arranged in a plurality of columns, each comprised of a plurality of bit cells;
   (c) a plurality of sense amplifiers, each of said columns being associated with one of said sense amplifiers;
   (d) wherein each of the sense amplifiers can be electrically coupled to any bit cell in any column with which that sense amplifier is associated;
   (e) an addressing circuit coupled to each of the sense amplifiers associated with columns of at least one word cell;
   (f) wherein the addressing circuit controls the coupling of the sense amplifiers to the bit cells of any row extending across the associated columns of the word cell; and
   (g) an input/output bus that extends onto the chip and is coupled to the sense amplifiers associated with each of the word cells;

wherein the improvement comprises further integrating on the chip:
   (h) a plurality of comparison circuits, each of which (i) is associated with one of the word cells, (ii) is coupled to the sense amplifiers associated with that word cell, (iii) has an output line, and (iv) is structured to compare a selected common comparand on the chip's input/output bus with a row of bits in the word cell amplified by said sense amplifiers and to generate an electrical signal on said output line when the comparand does not match the bits amplified from the bit cells in the row; and (i) a plurality of match flip-flops, each of which is associated with one of the word cells and each responsive to set and clear control inputs, and wherein the clear input for each word is coupled to the output line extending from the comparison circuit for the same word.

2. The processor of claim 1 wherein the sense amplifiers are also coupleable to write data into bit cells in associated columns, and wherein the comparison circuits of each word cell are further structured to compare the comparand with a row of bits while the sense amplifiers are amplifying and rewriting the bits of that row.

3. The processor of claim 1 further comprising an on-chip store sized to hold the comparand.

4. The processor of claim 1 further comprising a store sized to hold a mask for the comparand, and wherein an electrical signal on the output line of each comparison circuit indicates a mismatch between unmasked bits of the comparand and the subset of corresponding bits amplified from the row.

5. The processor of claim 1 wherein the bit cells of each word cell are arranged in eight columns, and wherein each word cell contains eight sense amplifiers.

6. The processor of claim 1 further comprising a parity-checking circuit structured and coupled to compute the exclusive-or of all bits stored in the bit cells of each row, once when the bits are first stored in the bit cells and once after the sense amplifiers are electrically coupled to that row, wherein said parity-checking circuit includes a comparator having an output line, and wherein the comparator is coupled to compare the two computed results and produce a signal on said output line if the comparison indicates a difference in the two results.

7. The processor of claim 1 further comprising a sequencing circuit coupled to the addressing circuit and structured to cause the addressing circuit to access in sequence a plurality of rows.

8. The processor of claim 7 wherein the sequencing circuit is structured to cause the addressing circuit to access all rows in the columns in a repeated and periodic fashion.

9. The processor of claim 8 wherein the sense amplifiers are also coupleable to write data into bit cells in associated columns.

10. The processor of claim 1 further comprising priority interconnection lines electrically coupling all word cells and structured to allow data to pass in either direction with respect to only one of said word cells at a time.

11. The processor of claim 1 wherein the number of columns is an integral power of two; and further comprising a store sized to hold a mask for the comparand; wherein an electrical signal on the output line of each comparison circuit indicates a mismatch between unmasked bits of the comparand and the subset of corresponding bits amplified from the row; further comprising priority interconnection lines electrically coupling all word cells and structured to allow data to pass in either direction with respect to only one of said word cells at a time; wherein the sense amplifiers are also coupleable to write data into bit cells in associated columns; and wherein the comparison circuits of each word cell are further structured to compare the comparand with a row of bits while the sense amplifiers are amplifying and re-writing the bits of that row.

12. A processor formed from a single-chip, dynamic data storage device including:
   (a) means for storing on the chip a multitude of bits divided among a plurality of logical words, arranged in an array having multiple columns and rows, wherein the bits of each word are grouped into a plurality of multi-bit columns;
   (b) sense amplifier means, integrated on the chip, for amplifying all bits in a row; and
   (c) addressing means, coupled to the sense amplifier means, for addressing any row of the columns by controlling the coupling between the sense amplifier means and the bits in the row of the columns;

wherein the improvement comprises further integrating on the chip:
   (d) comparison means, coupled to the sense amplifier means of each word, for comparing a selected comparand provided to the chip with bits of a row amplified by said sense amplifier means, and for generating an electrical signal on an output line for each word when the comparand does not match the amplified bits; and (e) latch means for holding a match signal for each word, which latch means is responsive to set and clear control inputs, each clear input being coupled to the output line for the same word.

13. The processor of claim 12 wherein the sense amplifier means further comprise means for re-writing data bits in associated columns, and wherein the comparison means is structured to compare the comparand to the bits of a row that the sense amplifiers are amplifying and re-writing.

14. The processor of claim 12 further comprising means for masking a subset of bits of the comparand and for generating an electrical signal indicating a mismatch when all unmasked bits representing a selected portion of the comparand do not match corresponding amplified bits.

15. The processor of claim 12 wherein each word is arranged into eight columns, and wherein the sense amplifier means comprises, for each word, eight separate sense amplifiers.

16. The processor of claim 12 further comprising means for accessing in sequence a plurality of rows in the columns in a repeated and periodic fashion by causing the addressing means to couple the sense amplifier means and each of the plurality of rows in a predetermined sequence.

17. The processor of claim 16 wherein the sense amplifier means further comprise means for re-writing data bits in associated columns.

18. The processor of claim 17 further comprising means for electrically signalling a selected one of a plurality of interconnected word cells on the chip, each of which word cells contains one word, when the selected cell has the highest priority among all of the interconnected word cells.

19. The processor of claim 18 further comprising means for parity-checking bits stored in a row by (a) computing the exclusive-or of all bits of the row, once when the bits are first stored and once after the sense amplifier means amplifies the bits of the row, (b) comparing the two computed results, and (c) generating a signal if the comparison indicates a difference between the two results.

20. Forming a processor from a single-chip, dynamic data storage device including:

(a) means for storing on the chip a multitude of bits divided among a plurality of logical words, arranged in an array having multiple columns and rows, wherein the bits of each word are grouped into a plurality of multi-bit columns;

(b) sense amplifier means, integrated on the chip, for amplifying all bits in a row; and (c) addressing means, coupled to the sense amplifier means, for addressing any row of the columns by controlling the coupling between the sense amplifier means and the bits in the row of the columns; comprising the step of further integrating on the chip:

(d) comparison means, coupled to the sense amplifier means of each word, for comparing a selected comparand provided to the chip with bits of a row amplified by said sense amplifier means, and for generating an electrical signal on an output line for each word when the comparand does not match the amplified bits; and (e) latch means for holding a match signal for each word, which latch means is responsive to set and clear control inputs, each clear input being coupled to the output line for the same word. .

* * * * *